(12) United States Patent
Hsu

(10) Patent No.: US 6,605,393 B2
(45) Date of Patent: Aug. 12, 2003

(54) ALTERNATIVE PSM WITH NEW PHASE CONFLICT CANCELING METHOD

(75) Inventor: Chung-Wei Hsu, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 10 days.

(21) Appl. No.: 09/847,485

(22) Filed: May 2, 2001

(65) Prior Publication Data
US 2003/0077519 A1 Apr. 24, 2003

(30) Foreign Application Priority Data
Feb. 9, 2001 (TW) .................................... 90102873 A

(51) Int. Cl.[7] .............................................. G03F 9/00
(52) U.S. Cl. ........................................................ 430/5
(58) Field of Search .............................. 430/5, 322, 323, 430/324; 716/19, 21

(56) References Cited

U.S. PATENT DOCUMENTS

| 5,464,712 A | * | 11/1995 | Ham | 430/5 |
| 5,702,848 A | * | 12/1997 | Spence | 430/5 |
| 6,280,888 B1 | * | 8/2001 | Nakabayashi et al. | 460/5 |

* cited by examiner

Primary Examiner—S. Rosasco
(74) Attorney, Agent, or Firm—Ladas & Parry

(57) ABSTRACT

An alternative PSM, including: a first transparent region in 0 degree phase, formed on the surface of a transparent substrate; and a second transparent region in 180 degree phase, constructed of a concave portion of the transparent substrate. The first transparent region and the second transparent region are alternatively arranged. A third transparent region in 85–95 degree phase, constructed of a translucent layer, is formed on the border between the first transparent region and the second transparent region. The third transparent region in 85–95 degree phase used as a light intensity buffer so as to effectively cancel phase conflict.

15 Claims, 5 Drawing Sheets

ALTERNATIVE PSM WITH NEW PHASE CONFLICT CANCELING METHOD

BACKGROUND OF THE INVENTION

1. Field of the Invention

The present invention relates in general to a phase shift mask(PSM). In particular, the present invention relates to a new alternative phase shift mask for canceling phase conflict.

With the trend of highly integrated semiconductor chips, the resolution provided by a photolithography technique has to be improved, and therefore the mask technique of patterning semiconductor chips has also developed.

2. Description of the Related Art

For example, a phase shift mask, in contrast to a conventional mask, comprises a phase shift layer. Therefore, when an exposure light source passes through phase shift layer regions and non phase shift layer regions to reach the positive photo resistance of a semiconductor substrate, a phase difference of 180 degree is generated. This interference generates an offset to the boundary of to-be-shifted patterns so as to further improve the contrast of the pattern.

There is an alternative phase shift mask as shown in FIG. 1, wherein a phase shift layer region 14 and a non phase shift layer region 16 of different depths are formed by alternatively etching a portion of a transparent substrate 10 on the mask which is traditionally constructed of a chrome layer 12 and a transparent substrate 10. The phase shift layer region 14 is in 180 degrees phase represented by the symbol π, and non phase shift layer region 16 is in 0 degrees phase. Therefore, when the exposure light source 18 passes through the phase shift layer region 14 and non phase shift layer region 16, a phase difference of 180 degrees is generated.

Further, there is a half-tone phase shift mask (half-tone PSM) or an attenuated phase shift mask (attenuated PSM, APSM), as shown in FIGS. 2a–2c. The surface of the APSM is mainly divided into two regions, which are the wholly transparent region 24 in 0 degree phase and the attenuated transparent region 22 in 180 degree phase. The wholly transparent region 24 is mainly constructed of quartz, and the attenuated transparent region 22 has an extra MoSiON layer. The transparency of the wholly transparent region 24 is close to 100%. The transparency of the attenuated transparent region 22, much less than that of the wholly transparent region 24, is within 10%, possibly less than 4 or 6%. As shown in FIG. 2b, it can be seen from the electric field E of the exposure light sources 28 distributed on the positive photo resist of the semiconductor substrate that the exposure light source 28 has 180 degree phase difference between passing through the attenuated transparent region 22 and passing through the wholly transparent region 24. As shown in FIG. 2c, since the exposure light source exposed on the positive photo resist of the semiconductor substrate has a light intensity I proportional to the square of the electric field E. Therefore, the contrast between the wholly transparent region 24 and the attenuated transparent region 22 can be clearer, so that the resolution of the exposure process can be improved.

Refer to FIG. 3. There is a problem incurred when the above mask is manufactured. Since there are lights of two opposite phases during exposure, there is an area having a light intensity of zero corresponding to the border between the phase shift layer region and the non phase shift layer region or the wholly transparent region and the attenuated transparent region on the semiconductor chip. Therefore, when a mask of this kind is applied to the positive photo resist 30, a ghost line 32 is formed.

There are two traditional ways to eliminate the ghost line. The first option is to manufacture a multi-phase stair-step PSM, wherein a variety of regions in different phase differences, such as transparent regions in phases of 0, 60, 120, 180 degrees in sequence, are formed on the mask so as to alleviate a ghost line phenomenon generated during exposure. However, there are problems incurred. That is, not only is mask complexity increased due to laterally increased regions in different phase differences, but also the occupied area, which is accordingly increased, is opposed to the trend of shrinking a semiconductor chip pattern.

The alternative is double exposure. That is, a first mask is used to perform a first exposure so as to form a desired pattern on a positive photo resist. Then, the desired pattern that is already formed is shielded and a second mask is used to perform a second exposure so as to eliminate unwanted patterns such as ghost lines. However, running time is greatly increased. Also, if the pattern tends to shrink, it is a handicap to the alignment between the first and the second masks.

Accordingly, it is a principal object of the present invention to manufacture an alternative PSM for eliminating a phase conflict phenomenon on the border between two different phase regions.

SUMMARY OF THE INVENTION

According to the above objectives, a method of manufacturing an alternative PSM of the present invention includes the following steps: first, a translucent layer and a light-shielding layer are sequentially formed on a transparent substrate; then, the light-shielding layer is defined to form a light-shielding pattern; then, the light-shielding pattern is used as a mask to etch the translucent layer to the transparent substrate so as to form a first transparent region in 0 degree phase; a first transparent region is defined to alternatively form a second transparent region in 180 degree phase; the translucent layer is left on the border between the first transparent region in 0 degree phase and the second transparent region in 180 degree phase to form a third translucent region in 85–95, generally 90 degree phase.

A light intensity buffer region formed by the third translucent region in 85–95 degree phase can cancel a phase conflict on the border between the first transparent region in 0 degree phase and the second transparent region in 180 degree phase, and further eliminate ghost lines which are generated during exposing the positive photo resist layer on the semiconductor substrate.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Refer to FIGS. 4 to 7, which are cross-sectional diagrams of an Alt-PSM in a manufacturing process of the present invention.

Figure 4:
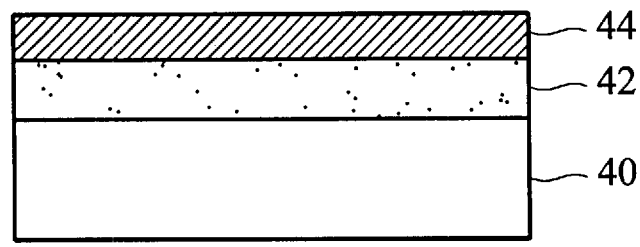
FIG. 4 to FIG. 7 are cross-sectional diagrams of an Alt-PSM in a manufacturing process in accordance with an embodiment of the present invention.

As shown in FIG. 4, the present invention provides a method of manufacturing Alt-PSMs. According to the present invention, first, a translucent layer 42 and a light-shielding layer 44 are sequentially formed on a transparent substrate 40. For example, a substrate 10, which is constructed of quartz, has transparency which is defined about 100% relative to an exposure light source in a semiconductor photolithography process; the translucent layer 42, which is constructed of $Mo_xSi_yO_z$, CrFx, has transparency which is defined about 40–60%, better 50%, relative to an exposure light source in a semiconductor photolithography process; the light-shielding layer 44, which is constructed of chrome, has transparency which is defined about 0% relative to an exposure light source in a semiconductor photolithography process.

Figure 5:
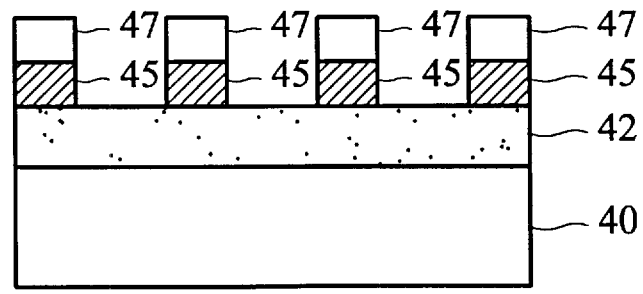

Then, referring to FIG. 5, the light-shielding layer 44 is defined to form light-shielding patterns 45. For example, the chrome layer 44 is first coated with a photo resistant material (not shown) on the surface. Then, photo resistant patterns 47 are formed on a predetermined area via an exposure and development process. Then, the photo resistant patterns 47 are used as masks for etching the chrome layer 44 to the surface of the translucent layer 42 so as to form light-shielding patterns 45. Then, the photo resist patterns 47 are removed.

Figure 6:
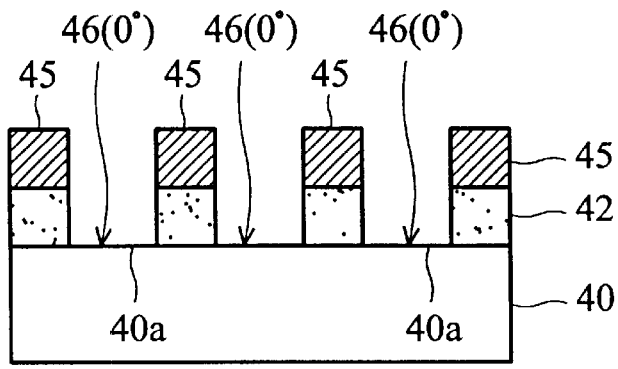

Referring to FIG. 6, the light-shielding patterns 45 are used as masks for etching the translucent layer 42 to the transparent substrate 40 so as to form first transparent regions 46 in 0 degree phase on transparent substrate surfaces 40a.

Figure 7:
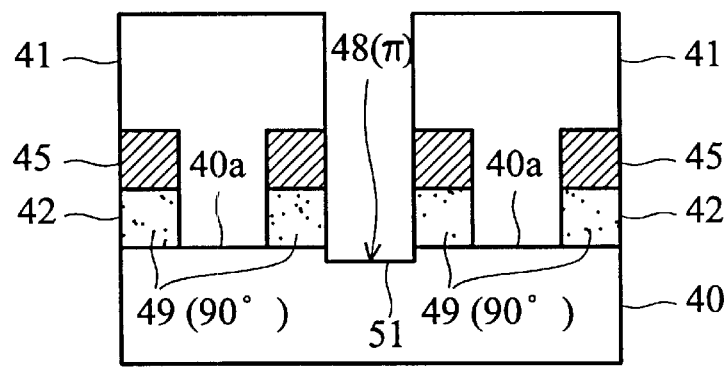

Then, referring to FIG. 7, the first transparent regions 46 are defined to alternatively form second transparent regions 48 in 180 degree phase (wherein 180 degree phase is denoted by a symbol p). For example, photo resist material (not shown) is first coated, and then a photo resist pattern 41 is formed on a predetermined area via an exposure and development process. Then, the photo resist pattern 41 is used as a mask for etching the transparent substrate 40 to a predetermined depth d so as to form concave portions 51 which construct second transparent regions 48 in 180 degree phase. Then, the photo resist pattern 41 is removed. A translucent layer is left on the common border between the first transparent region 46 in 0 degree phase and the second transparent region 48 in 180 degree phase so as to form a third translucent region 49 in 85–95, generally 90 degree phase.

Figure 8:
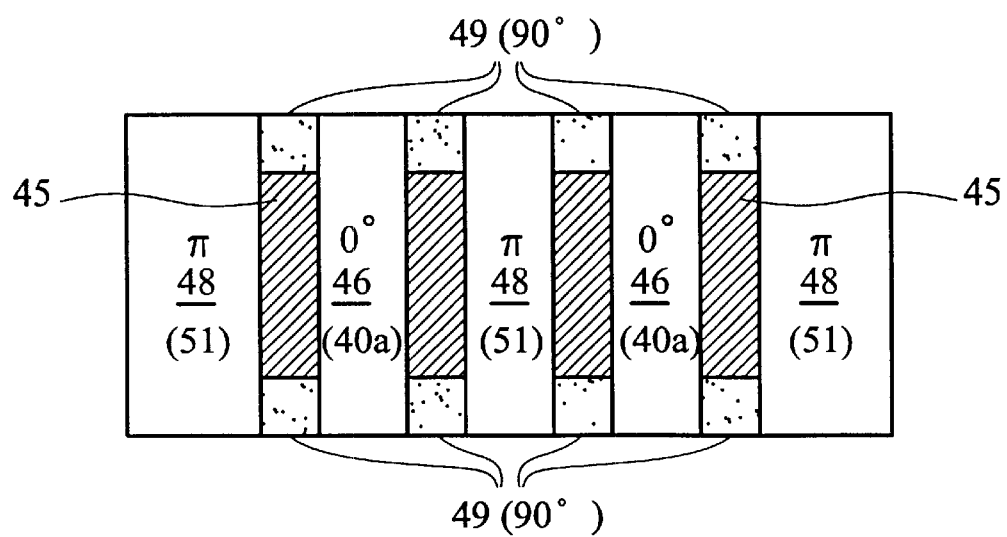
FIG. 8 shows an aerial image of an Alt-PSM in accordance with an embodiment of the present invention.

Refer to FIG. 8, which shows an aerial image of Alt-PSM that is completed via the manufacturing process of FIGS. 4–7 in accordance with an embodiment of the present invention. In FIG. 8 a transparent substrate 40 includes: a concave portion 51; a first transparent region 46 in 0 degree phase, formed on a surface 40a of the transparent substrate 40; a second transparent region 48 in 180 degree phase, which is alternatively arranged with the first transparent region 46 in 0 degree phase, wherein the second transparent region 48 in 180 degree phase is constructed of the concave portion 51 of the transparent substrate; a third translucent region 49 in 85–95 degree phase, which is formed by a translucent layer left on the common border between the first transparent region 46 in 0 degree phase and the second transparent region 48 in 180 degree phase. Besides, a light-shielding layer 45, which is constructed of material such as chrome, is formed on the partial surface of the translucent layer 49.

Refer to FIGS. 9a to 9d, which show aerial images of the results of performing exposure and development on positive photo resist under different conditions. The symbol I represents the exposure light intensity on photo resist. The light intensity under 0.3 represents insufficient exposure, and the photo resist pattern will be left undeveloped.

Figure 1:
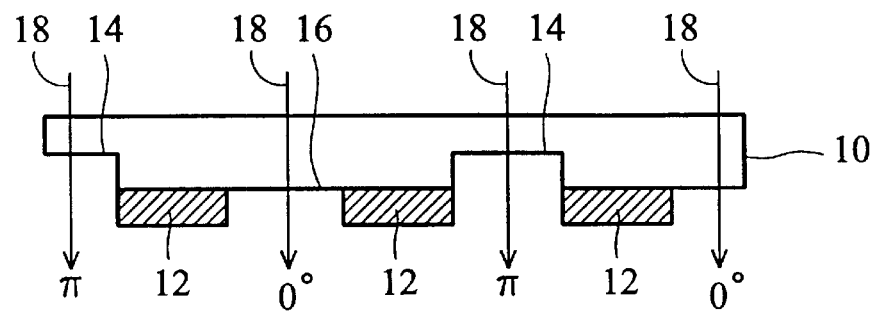
FIG. 1 is a cross-sectional diagram of a conventional alternative mask.
Figure 2A:
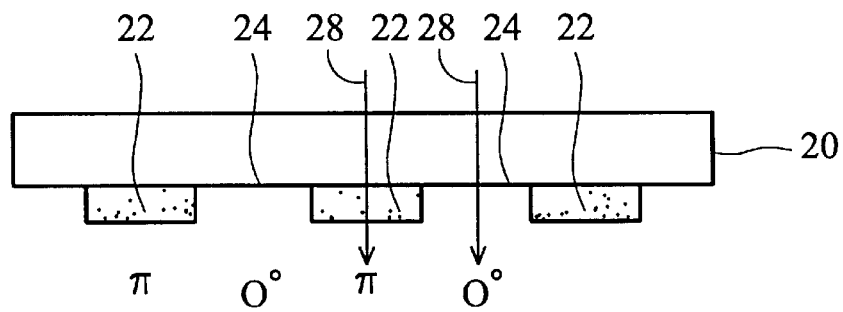
FIGS. 2a–2c are cross-sectional diagrams of a conventional attenuated mask and show distributions of electric field and light intensity corresponding to positive photo resist on a semiconductor substrate.
Figure 2B:
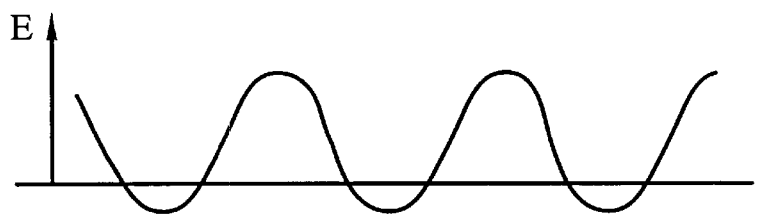
Figure 2C:
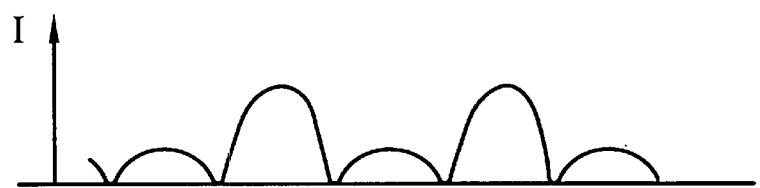
Figure 3:
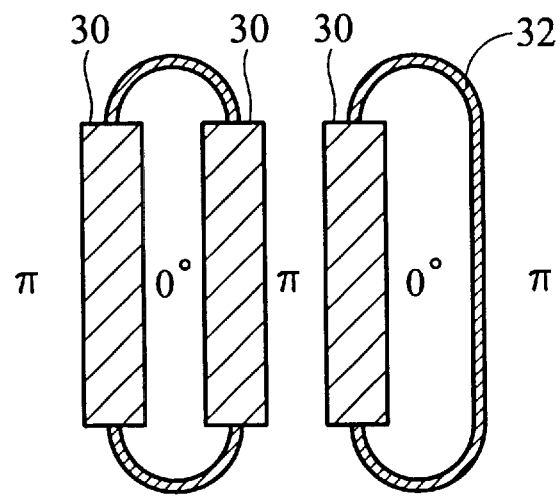
FIG. 3 shows a schematic diagram of ghost lines generated by exposing an attenuated mask on positive photo resist.
Figure 9A:
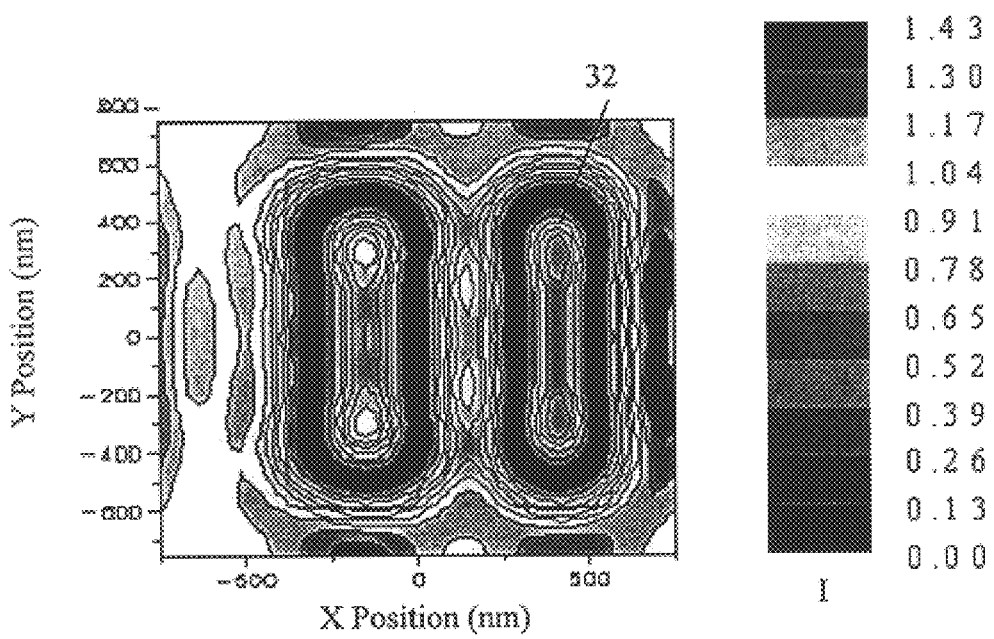
FIGS. 9a–9d are resultant aerial images after performing exposure and development on positive photo resist under different conditions.

Refer to FIG. 9a along with FIG. 3. FIG. 9a shows the ghost lines 32 which are left from exposure performed by using a traditional alternative phase shift mask.

Figure 9B:
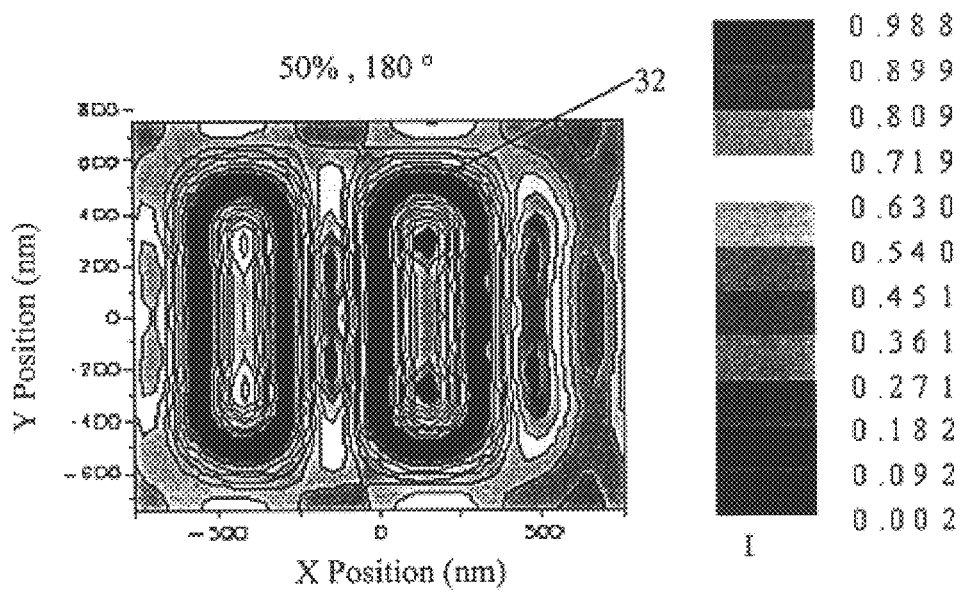
Figure 9C:
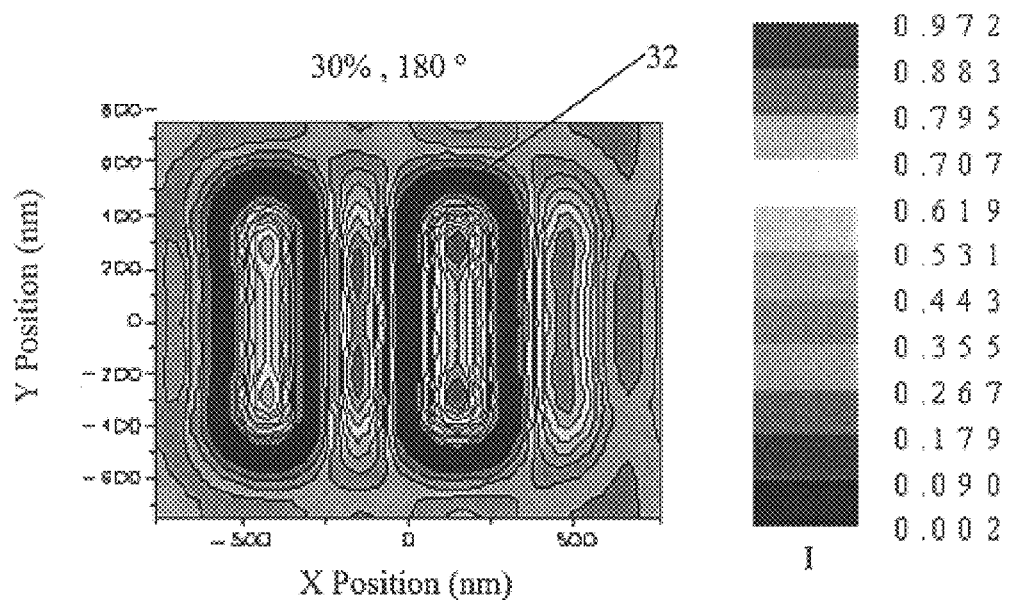

Refer to FIGS. 9b, 9c, which show the ghost lines 32 that can't be eliminated when transparent regions in 180 degree phase having 30% and 50% transparency are used as phase buffers for the common border between the first transparent region 46 in 0 degree phase and the second transparent region 48 in 180 degree phase.

Figure 9D:
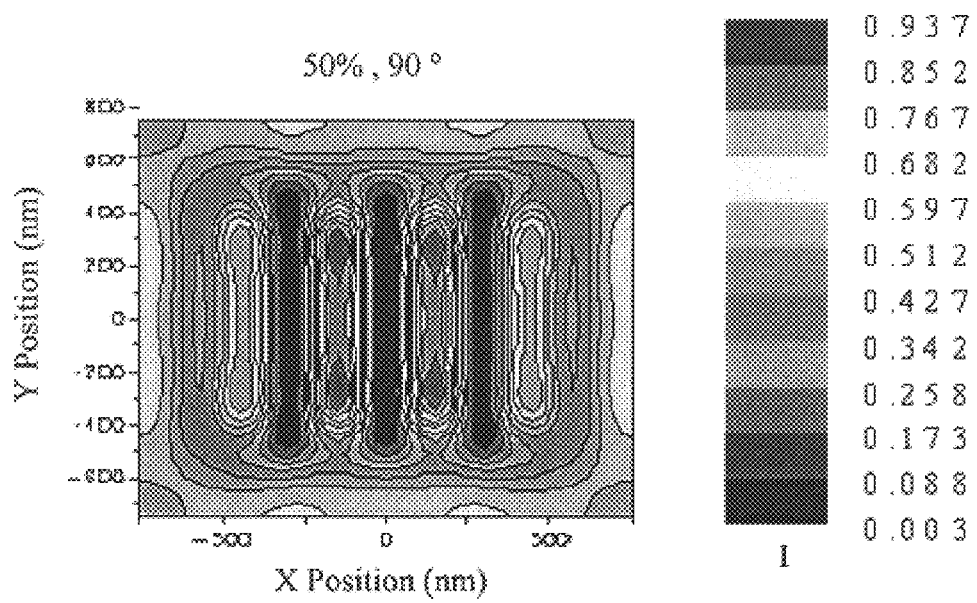

Refer to FIG. 9d, which shows that the ghost lines 32 are eliminated when translucent regions in 90 degree phase having 50% transparency are used as phase buffers for the common border between the first transparent region 46 in 0 degree phase and the second transparent region 48 in 180 degree phase.

The effects of the present invention are described as follows:

1. The ghost line generated from phase conflict is efficiently eliminated when a third translucent region in 85–95 degree phase is used as a light intensity buffer for the common border between the first transparent region in 0 degree phase and the second transparent region in 180 degree phase.

2. The process for manufacturing a mask of the embodiment is easy, wherein complexity in the process of manufacturing a traditional phase stair-step mask can be improved.

3. Only one mask is used for performing exposure so as to reduce the running time for traditional double exposure.

4. Accordingly, the cost of mask manufacturing can be greatly reduced.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of manufacturing an alternative PSM, comprising the steps of:

providing a transparent substrate;

sequentially forming a translucent layer and a light-shielding layer on said transparent substrate;

defining said light-shielding layer to form a light-shielding pattern;

etching said translucent layer to expose said transparent substrate to form a first transparent region in 0 degree phase by using said light-shielding pattern as a mask; and defining said first transparent region in 0 degree phase to alternatively form a second transparent region in 180 degree phase, wherein a part of said translucent layer is left on a common border between said first transparent region in 0 degree phase and said second transparent region in 180 degree phase to form a third translucent region in 85–95 degree phase.

2. The method as claimed in claim 1, wherein said transparent substrate is constructed of quartz.

3. The method as claimed in claim 1, wherein said transparent substrate has 100% transparency relative to an exposure light source.

4. The method as claimed in claim 1, wherein said translucent layer is constructed of $Mo_xSi_yO_z$.

5. The method as claimed in claim 1, wherein said translucent layer has 40–60% transparency relative to an exposure light source.

6. The method as claimed in claim 1, wherein said light-shielding layer is constructed of chromes.

7. The method as claimed in claim 1, wherein said light-shielding layer has 0% transparency relative to an exposure light source.

8. An alternative PSM, comprising:

a transparent substrate, which has a substrate surface and a concave portion;

a first transparent region in 0 degree phase, formed on a surface of said transparent substrate; and a second transparent region in 180 degree phase, alternatively arranged with said first transparent region in 0 degree phase, wherein said second transparent region in 180 degree phase is constructed of the concave portion of said transparent substrate, and wherein a part of a translucent layer is left on a common border between said first transparent region in 0 degree phase and said second transparent region in 180 degree phase to form a third translucent region in 85–95 degree phase.

9. The alternative PSM as claimed in claim 8, wherein a light-shielding layer is formed on a partial surface of said translucent layer.

10. The alternative PSM as claimed in claim 9, wherein said light-shielding layer is constructed of chrome material.

11. The alternative PSM as claimed in claim 9, wherein said light-shielding layer has 0% transparency relative to an exposure light source.

12. The alternative PSM as claimed in claim 8, wherein said transparent substrate is constructed of quartz.

13. The alternative PSM as claimed in claim 8, wherein said transparent substrate has 100% transparency relative to an exposure light source.

14. The alternative PSM as claimed in claim 8, wherein said translucent layer is constructed of $Mo_xSi_yO_z$.

15. The alternative PSM as claimed in claim 8, wherein said translucent layer has 40–60% transparency relative to an exposure light source.

* * * * *